US010830851B2

(12) United States Patent
Wald et al.

(10) Patent No.: US 10,830,851 B2
(45) Date of Patent: Nov. 10, 2020

(54) METHODS FOR SPATIALLY ENCODING MAGNETIC RESONANCE SIGNALS WITH SWEPT RADIO FREQUENCY (RF) PULSES APPLIED WITH RF SPATIAL PHASE GRADIENTS

(71) Applicant: The General Hospital Corporation, Boston, MA (US)

(72) Inventors: Lawrence L. Wald, Cambridge, MA (US); Clarissa Z. Cooley, South Boston, MA (US); Jason Stockmann, Cambridge, MA (US); Bastien Guerin, Cambridge, MA (US); Matthew Rosen, Somerville, MA (US)

(73) Assignee: The General Hospital Corporation, Boston, MA (US)

( * ) Notice: Subject to any disclaimer, the term of this patent is extended or adjusted under 35 U.S.C. 154(b) by 97 days.

(21) Appl. No.: 16/092,686

(22) PCT Filed: Apr. 11, 2017

(86) PCT No.: PCT/US2017/026948
§ 371 (c)(1),
(2) Date: Oct. 10, 2018

(87) PCT Pub. No.: WO2017/180586
PCT Pub. Date: Oct. 19, 2017

(65) Prior Publication Data
US 2019/0128982 A1 May 2, 2019

Related U.S. Application Data

(60) Provisional application No. 62/320,923, filed on Apr. 11, 2016.

(51) Int. Cl.
*G01R 33/483* (2006.01)
*G01R 33/48* (2006.01)
(Continued)

(52) U.S. Cl.
CPC ...... *G01R 33/4831* (2013.01); *G01R 33/4822* (2013.01); *G01R 33/5608* (2013.01); *G01R 33/5617* (2013.01); *G01R 33/482* (2013.01)

(58) Field of Classification Search
CPC ............ G01R 33/4831; G01R 33/5617; G01R 33/5608; G01R 33/4822; G01R 33/482
(Continued)

(56) References Cited

U.S. PATENT DOCUMENTS 6,037,772 A * 3/2000 Karczmar .......... G01R 33/4833
324/309
8,258,786 B2 * 9/2012 Hennel ................ G01R 33/246
324/307

OTHER PUBLICATIONS

O'Dell, L.A., 2013. The WURST kind of pulses in solid-state NMR. Solid state nuclear magnetic resonance, 55, pp. 28-41. (Year: 2013).*

(Continued)

*Primary Examiner* — Christopher P McAndrew
(74) *Attorney, Agent, or Firm* — Quarles & Brady LLP

(57) ABSTRACT

Described here are systems and methods for performing magnetic resonance imaging ("MRI") using radio frequency ("RF") phase gradients to provide spatial encoding of magnetic resonance signals rather than the conventional magnetic field gradients. Particularly, the systems and methods described here implement swept RF pulses (e.g., wideband, uniform rate, and smooth transition ("WURST") RF pulses) and a quadratic phase correction to enable RF phase gradient encoding in inhomogeneous background ($B_0$) magnetic fields.

17 Claims, 4 Drawing Sheets

(51) Int. Cl.
*G01R 33/56* (2006.01)
*G01R 33/561* (2006.01)
(58) Field of Classification Search
USPC .......................................................... 324/309
See application file for complete search history.

(56) References Cited

OTHER PUBLICATIONS

Casabianca, L.B., Mohr, D., Mandal, S., Song, Y.Q. and Frydman, L., 2014. Chirped CPMG for well-logging NMR applications. Journal of Magnetic Resonance, 242, pp. 197-202. (Year: 2014).*
Shrot, Y. and Frydman, L., 2008. Spatial encoding strategies for ultrafast multidimensional nuclear magnetic resonance. The Journal of chemical physics, 128(5), p. 052209. (Year: 2008).*
Weiger, M., Hennel, F. and Pruessmann, K.P., 2010. Sweep MRI with algebraic reconstruction. Magnetic resonance in medicine, 64(6), pp. 1685-1695. (Year: 2010).*
Porter, B.A., Hastrup, W., Richardson, M.L., Wesbey, G.E., Olson, D.O., Cromwell, L.D. and Moss, A.A., 1987. Classification and investigation of artifacts in magnetic resonance imaging. Radiographics, 7(2), pp. 271-287. (Year: 1987).*
Sharp, J.C. and King, S.B., 2010. MRI using radiofrequency magnetic field phase gradients. Magnetic Resonance in Medicine: An Official Journal of the International Society for Magnetic Resonance in Medicine, 63(1), pp. 151-161. (Year: 2010).*
Bellec J, et al. Target field based RF phase gradient transmit array for 3D TRASE MRI. Int. Soc. Magn. Reson. Med. 2013:138.
Cao Z, et al. Frequency encoding by Bloch-Siegert shift. Proc. 22nd Annu. Meet. Int. Soc. Magn. Res. Med. 2014:4220.
Cooley, C. Z., Portable low-cost magnetic resonance imaging. Diss. Massachusetts Institute of Technology, 2014.
Cooley, C. Z., et al. "Two-dimensional imaging in a lightweight portable MRI scanner without gradient coils." Magnetic resonance in medicine 73.2 (2015): 872-883.
Deng Q, et al. B1 transmit phase gradient coil for single-axis TRASE RF encoding. Magn. Reson. Imag. 2013;31:891-899. http://dx.doi.org/10.1016/j.mri.2013.03.017.
International Searching Authority, International Search Report and Written Opinion for application PCT/US2017/026948, dated Jul. 12, 2017.
Kartäusch R, et al. Spatial phase encoding exploiting the Bloch-Siegert shift effect. MAGMA. 2014;27:363-371. http://dx.doi.org/10.1007/s10334-013-0417-0.
King, S. B., et al. "Phase encoding without gradients using TRASE-FSE MRI." Proc Intl Soc Mag Reson Med. vol. 15. 2007.
Koroleva VDM, et al. Broadband CPMG sequence with short composite refocusing pulses. J. Magn. Reson. 2013;230:64-75. http://dx.doi.org/10.1016/j.jmr.2013.01.006.
Kunz D. Frequency-modulated radiofrequency pulses in spin-echo and stimulated-echo experiments. Magn. Reson. Med. 1987;4:129-136.
Mandal S, et al. An ultra-broadband low-frequency magnetic resonance system. J. Magn. Reson. 2014;242:113-125. http://dx.doi.org/10.1016/j.jmr.2014.02.019.
Maudsley A. Dynamic range improvement in NMR imaging using phase scrambling. J. Magn. Reson. 1988;72:287-305.
Park J-Y, et al. Spin-echo MRI using pi/2 and pi hyperbolic secant pulses. Magn. Reson. Med. 2009;61:175-187. http://dx.doi.org/10.1002/mrm.21822.
Pipe JG. Spatial encoding and reconstruction in MRI with quadratic phase profiles. Magn. Reson. Med. 1995;33:24-33.
Salajeghe S, et al. Non-linear TRASE. Proc. 23rd Annu. Meet. Int. Soc. Magn. Res. Med. 2015:2461.
Schmidt R, et al. New spatiotemporal approaches for fully refocused, multislice ultrafast 2D MRI. Magn. Reson. Med. 2014;71(2):711-722. http://dx.doi.org/10.1002/mrm.24714.
Sharp J, et al. Imaging without gradients: first in vivo MR images using the TRASE RF imaging method. Proc. 20th Annu. Meet. Int. Soc. Magn. Res. Med. 2012:705.
Sharp JC, et al. Point-spread-functions for RF imaging with TRASE: implications for phase gradient coil design and flip angle calibration. Proc. 18th Annu. Meet. Int. Soc. Magn. Res. Med. 2010:1469.
Sharp, J. C., et al. "High-resolution MRI encoding using radiofrequency phase gradients." NMR in Biomedicine 26.11 (2013): 1602-1607.
Snyder AL, et al. MRI by steering resonance through space. Magn. Reson. Med. 2014;72:49-58. http://dx.doi.org/10.1016/j.micinf.2011.07.011.Innate.
Stockmann JP, et al. "Transmit Array Spatial Encoding (TRASE) using broadband WURST pulses for RF spatial ancoding in inhomogeneous B0 fields." Journal of Magnetic Resonance 268 (2016): 36-48. Published online Apr. 8, 2016.
Stockmann JP, et al. Transmit Array Spatial Encoding (TRASE) with broadband WURST pulses for robust spatial ancoding in inhomogeneous B0. Proc. 23rd Annu. Meet. Int. Soc. Magn. Res. Med., Toronto. 2015:0917.
Tal A, et al. A continuous phase-modulated approach to spatial encoding in ultrafast 2D NMR spectroscopy. J. Magn. Reson. 2005;176:107-114. http://dx.doi.org/10.1016/j.jmr.2005.05.009.
Tal A, et al. Spatial encoding and the single-scan acquisition of high definition MR images in inhomogeneous fields. J. Magn. Reson. 2006;182:179-194. http://dx.doi.org/10.1016/j.jmr.2006.06.022.
Tannés A, et al. Adiabatic pulses. NMR Biomed. 1997;10:423-434. http://www.ncbi.nlm.nih.gov/pubmed/9542739.
Witschey WRT, et al. Localization by nonlinear phase preparation and k-space trajectory design. Magn. Reson. Med. 2012;67:1620-1632. http://dx.doi.org/10.1002/mrm.23146.

* cited by examiner

METHODS FOR SPATIALLY ENCODING MAGNETIC RESONANCE SIGNALS WITH SWEPT RADIO FREQUENCY (RF) PULSES APPLIED WITH RF SPATIAL PHASE GRADIENTS

STATEMENT REGARDING FEDERALLY SPONSORED RESEARCH

This invention was made with government support under EB018976 awarded by the National Institutes of Health. The government has certain rights in the invention.

CROSS-REFERENCE TO RELATED APPLICATIONS

This application is a U.S. National Phase of PCT Application No. PCT/US2017/026948 filed on Apr. 11. 2017, which claims the benefit of U.S. Provisional Patent Application Ser. No. 62/320,923, filed on Apr. 11, 2016, and entitled "METHODS FOR SPATIALLY ENCODING MAGNETIC RESONANCE SIGNALS WITH SWEPT RADIO FREQUENCY (RF) PULSES APPLIED WITH RF PHASE GRADIENTS."

BACKGROUND

Transmit Array Spatial Encoding ("TRASE") is a promising new magnetic resonance encoding method that uses transmit radio frequency ("RF") spatial phase gradients over the field-of-view to perform Fourier spatial encoding. TRASE enables magnetic resonance imaging ("MRI") without the need to use magnetic field gradients, which can dramatically simplify the MRI hardware, lower the cost of the MRI scanner, and reduce the power needed to run the MRI scanner.

TRASE has previously been used to perform high-resolution imaging in MRI scanners by replacing one or more conventional magnetic field gradients with RF transmit field (B1+) TRASE encoding. TRASE acquisitions require a spin-echo train, in which the transmit coil phase ramp switches polarity between successive echoes in the train in order to jump from one k-space point to the next. However, when conventional hard RF pulses are used in samples containing a broad bandwidth of spins, severe image artifacts will arise, often even when the bandwidth of the RF pulse nominally "covers" the resonance distribution of the spins in the sample (e.g., phase errors can accumulate for off-resonance spins). This situation arises when samples are imaged in an inhomogeneous background magnetic field ($B_0$).

TRASE does not use a modulation of the $B_0$ field (e.g., by applying gradient or encoding magnetic fields, as is done in traditional MRI) to spatially encode magnetic resonance signals, but it does suffer from secondary effects of the inhomogeneous field. Severe artifacts arise in TRASE images due to off-resonance effects when the RF pulse does not provide a full excitation and refocusing effect over the full bandwidth of spin resonances in the imaging FOV. To increase the bandwidth of a hard RF pulse, the only solution is to decrease its duration. Since the integral of the pulse dictates the flip-angle, increasing the bandwidth at constant flip-angle requires the amplitude of the pulse to be increase. Thus, for highly inhomogeneous $B_0$ fields, the peak RF power needed for high-bandwidth refocusing hard pulses becomes very high (e.g., increasing with the square of the amplitude), which is very expensive as the cost of RF amplifiers increases rapidly with power. This also adds the complexity of having to build RF coils that can withstand thousands high voltage.

SUMMARY OF THE DISCLOSURE

The present disclosure addresses the aforementioned drawbacks by providing a method for implementing transmit array spatial encoding of magnetic resonance signals in inhomogeneous $B_0$ fields without the use of magnetic field gradients. The method can include applying a swept radio frequency (RF) excitation pulse with a magnetic resonance imaging (MRI) system to a field-of-view to excite spins therein. A series of swept RF refocusing pulses are then applied with the MRI system to the field-of-view to refocus spins therein to form an echo train in which odd-numbered echoes in the echo train are conventional spin echoes and even-numbered echoes in the echo train are spectral spin echoes. Each of these swept RF refocusing pulses is applied using an RF coil that generates an RF phase gradient along a spatial direction. Data are acquired by sampling echoes in the echo train using the MRI system, whereby the RF phase gradients with which the swept RF refocusing pulses are applied provide spatial encoding of magnetic resonance signals associated with the echoes in the echo train.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
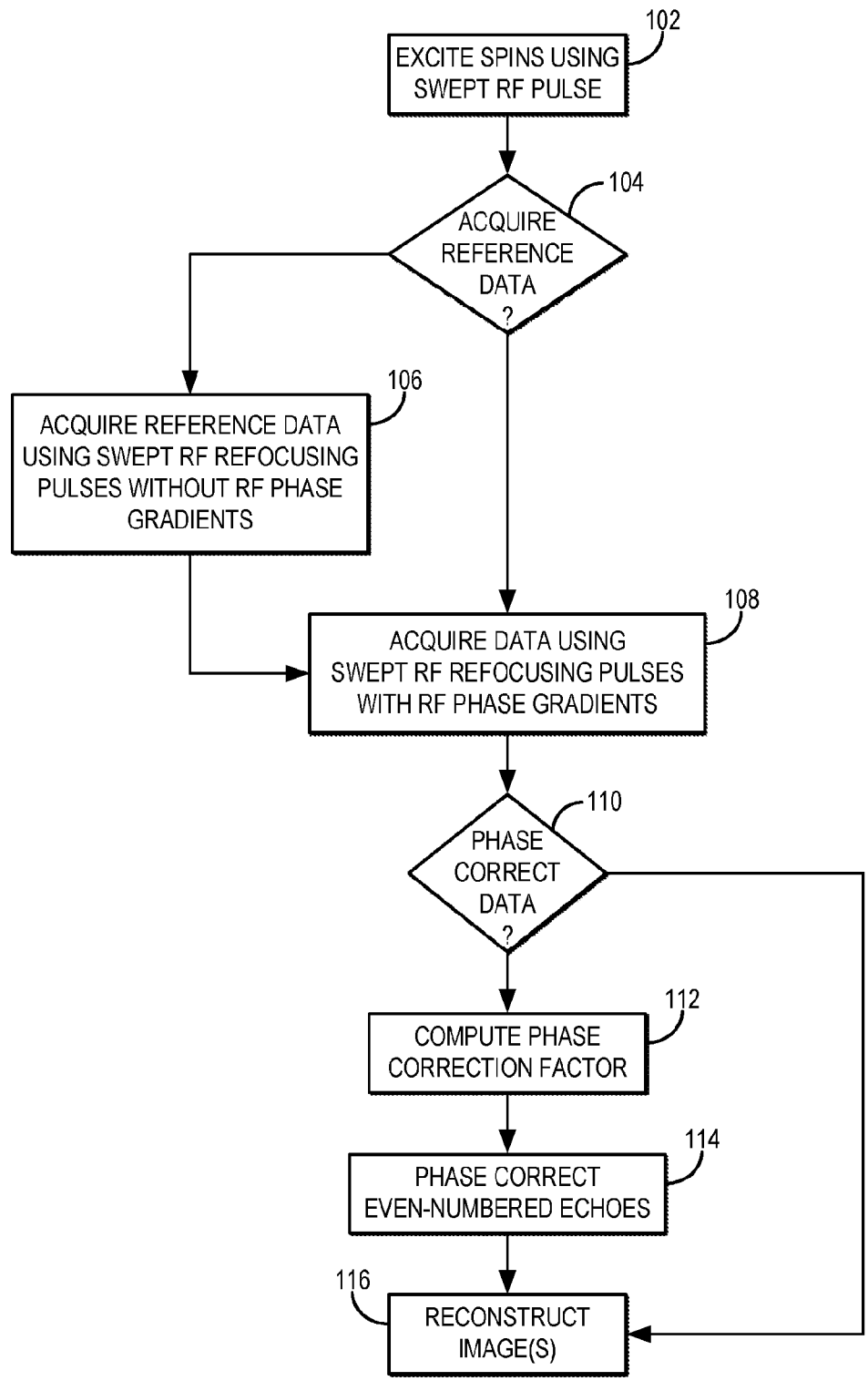
FIG. 1 is a flowchart setting forth the steps of an example method for magnetic resonance imaging ("MRI") using swept radio frequency ("RF") pulses with applied RF phase gradients to provide spatial encoding of magnetic resonance signals.
Figure 2A:
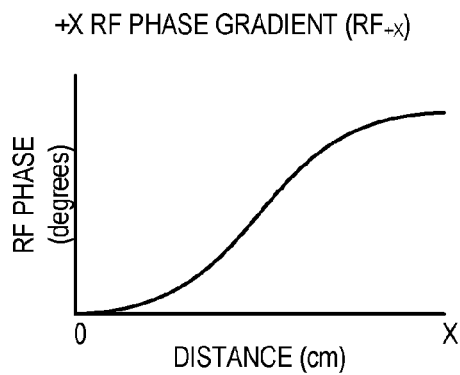
FIGS. 2A-2D illustrate example RF phase gradients.
Figure 2B:
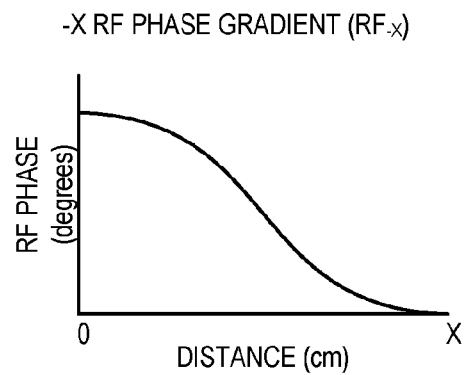
Figure 2C:
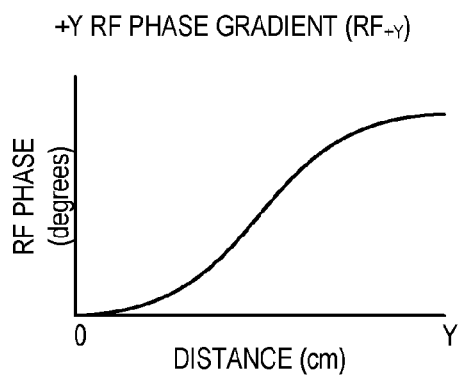
Figure 2D:
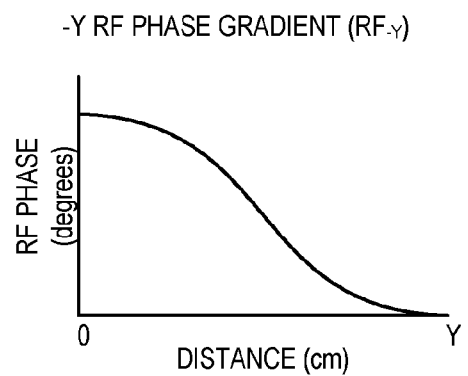

Specialized, portable MRI systems have the potential to make MR-based neuroimaging possible at sites where it is currently unavailable. Portable MRI systems also enable immediate "point-of-care" detection and diagnosis of acute intracranial pathology, which can be critical in patient management. For example, the characterization of acute post-traumatic space occupying brain hemorrhage is a time-sensitive emergency for which simple clinical assessment and even urgent CT scanning may be insufficient. Although conventional MRI scanners are capable of making this diagnosis, they are not available in remote locations. In Intensive Care Units, MRI scanners are generally nearby, but are difficult to utilize because of the dangers associated with transporting critical care patients. A portable, bed-side MRI scanner could offer major benefits in such situations.

Portable, low-cost MRI scanners are compelling for applications where power, siting, and cost constraints prohibit conventional MRI scanners. Examples include clinics in rural or underdeveloped areas, military field hospitals, sports arenas, and ambulances. Moreover, analogous to the current use of ultrasound, a low-cost and easy-to-implement portable MRI scanners could find uses in neurology, neurosurgery, or neuro-oncology examination rooms for routine disease monitoring (e.g., monitoring ventricle size after stent placement). The development of a portable scanner relies on the design of new image encoding methods and simplified hardware.

A major difference between portable NMR systems and conventional MRI scanners is that, in the former, the main $B_0$ field is usually inhomogeneous. This concession can dramatically reduce the complexity and size of the device, thus minimizing weight, cost, and power requirements and enhancing portability. However, this inhomogeneity introduces two significant obstacles to performing Fourier imaging with conventional $B_0$ gradient encoding. First, the bandwidth of spins in the sample may become too broad to be excited by typical RF pulses (e.g., hard pulses) at readily obtainable or safe RF power levels. Second, to perform traditional Fourier readout spatial encoding (and/or slice selection), the applied linear $B_0$ gradients must dominate the variations in the background $B_0$ field. Thus, very large encoding gradients are required for traditional magnetic field-based spatial encoding in a portable device with an inhomogeneous magnetic field.

It is impractical to simply "scale down" a conventional MRI scanner into a small mobile system. Instead, different approaches to spatial encoding are needed to eliminate as much hardware as possible. For example, a portable MRI system can be designed to eliminate the $B_0$ electromagnet, cryostat, and cryopump as well as the gradient coils, gradient amplifiers, and associated cooling. Such an MRI scanner eliminates the need for high-power electrical outlets, allowing it to be plugged into a conventional 110V wall outlet. This reduction in complexity, however, requires spatial encoding techniques that do not rely on magnetic field gradients.

Described here are systems and methods for performing MRI using RF phase gradients to provide spatial encoding of magnetic resonance signals rather than the conventional magnetic field gradients. Particularly, the systems and methods described here implement swept RF pulses and a quadratic phase correction when performing transmit array spatial encoding ("TRASE"). In some embodiments, the swept RF pulses can be wideband, uniform rate, and smooth transition ("WURST") RF pulses; however, it will be appreciated that other broadband RF pulses, such as hyperbolic secant frequency swept RF pulses, can also be implemented.

The systems and methods described here utilize a train of swept RF refocusing pulses (e.g., WURST pulses) applied with different RF spatial phase gradients to achieve TRASE imaging. The RF spatial phase gradient can be flipped using a 180-degree phase shift in the RF pulse played on one of the RF coils in the transmit array. Advantageously, these techniques can be implemented in highly inhomogeneous magnetic fields (e.g., magnetic fields where $\Delta B_0/B_0$ is around one percent). By accurately exciting and refocusing the full bandwidth of spins, WURST pulses eliminate artifacts caused by the limited bandwidth of the hard pulses previously used for TRASE imaging.

Swept RF pulses enable spin echo trains in highly inhomogeneous $B_0$ fields with greatly reduced peak power demands on the RF power amplifier compared to the hard pulses previously used for TRASE imaging. By contrast, covering a wide bandwidth of spins (e.g., 30 kHz) with a hard pulse would require a very short pulse duration with peak power levels that are impractical for portable MRI scanners.

The systems and methods described here thus enable TRASE imaging techniques for portable imaging systems with inhomogeneous polarizing, $B_0$, magnetic fields. The swept RF TRASE techniques described here are particularly well-suited for portable MRI scanners where inhomogeneous $B_0$ fields are a byproduct of lightweight magnet design; where heavy, high power-consumption gradient coil systems are a limitation to siting the portable MRI system in non-conventional locations; and where synergy with the use of spin-echo trains is required to overcome intra-voxel dephasing (i.e., short T2*) in the inhomogeneous field.

Swept RF pulses are typically longer than hard pulses, which increases the echo spacing and lowers the amount of encoding that can be done in one echo train because the total echo train duration is limited by increased blurring due to T2 decay. However, higher spatial resolution can be recovered by acquiring k-space in a segmented manner. Data points from multiple spin echo trains can be combined and interleaved to form a fully-populated TRASE k-space dataset with many k-space samples.

The pulse sequences described here implement swept RF refocusing pulses, which cause spins with different frequencies to refocus at different times during signal readout. This, in turn, leads to the formation of a "spectral" spin echo resembling the frequency histogram in the excited spins. That is, spectral echoes form when different spin isochromats are acted upon at different points in time by the even-numbered swept RF refocusing pulses. The spectral spin echo effect is caused by a quadratic phase modulation of the signal in the frequency domain that corresponds to convolution with a chirp kernel in the time domain, effectively smearing the signal out over time. Described another way, spins acted upon at different times by the swept RF refocusing pulse will refocus at different times during the acquired spin echo.

Swept RF excitation and swept RF refocusing pulses with appropriate frequency sweep rates can be paired to cancel this quadratic phase modulation, leading to the formation of conventional spin echoes for odd-numbered echoes in a spin echo train. However, spectral spin echoes still occur for even-numbered echoes in the echo train, which complicates the use of these readouts for imaging.

A phase correction procedure can be used to remove the unwanted quadratic phase modulation caused by the swept RF pulses. Also, a scheme of alternating the phase of RF pulses in the train (e.g., between a phase of pi/2 and pi between successive pulses) can be employed to keep even echo and odd echo coherence pathways separate, which compensates for defects in the swept RF refocusing pulses. In other instances, the effect of the swept RF pulse on the echo shape can be incorporated into a generalized image reconstruction algorithm, thereby obviating the need for phase correction of even-numbered echoes.

In some embodiments, the phase correction uses two reference echoes acquired at the beginning of the echo train. These reference echoes are formed with swept RF refocusing pulses applied without RF phase gradient switching between echoes (i.e., the reference echoes do not have TRASE phase modulation). Because swept RF refocusing pulses are used, the first reference echo (an odd-numbered echo) is a conventional spin echo and the second reference echo (an even-numbered echo) is a spectral spin echo. Collectively, the data acquired by sampling these reference echoes can be referred to as reference data. Ignoring a very small T2 weighting, the only difference between the two reference echoes is the quadratic phase modulation imparted by the swept RF pulses.

The phase correction can be realized as either convolution of an echo by a chirp kernel in the time-domain or subtraction of the phase difference between the first and second echoes in the Fourier transform domain. These two operations are mathematically equivalent. Thus, as one example, phase correction may be implemented by computing the phase difference between the first and second reference echo in the Fourier transform domain and then using the computed phase difference to remove the quadratic phase modulation from the later acquired even-numbered echoes. It will be appreciated that this phase correction technique is generally applicable to echo trains acquired using swept RF refocusing pulses, independent of whether TRASE encoding is implemented. Thus, the phase correction can also be used for conventional or generalized $B_0$ projection imaging using built-in or applied $B_0$ field gradients.

Referring now to FIG. 1, a flowchart is illustrated as setting forth the steps of an example method for swept RF TRASE imaging. The method begins at step 102 by exciting spins in a field-of-view using a swept RF pulse (e.g., a WURST pulse). A determination is then made whether reference data are to be acquired to implement phase correction, as indicated at decision block 104. If reference data are to be acquired, swept RF refocusing pulses are applied to the field-of-view without any RF phase gradient switching, as indicated at step 106. As described above, in one example reference data are acquired from two echoes (a conventional spin echo and a spectral spin echo) formed in response to swept RF refocusing pulses applied without RF phase gradients.

If reference data are not to be acquired, or after reference data have been acquired, the method proceeds by acquiring data from an echo train formed in response to swept RF refocusing pulses applied with different RF phase gradients, as indicated at step 108. A determination is then made whether phase corrections should be applied based on acquired reference data, as indicated at decision block 110. If phase correction is the be implemented, then a phase correction factor is computed from the reference data, as indicated at step 112. For example, the phase correction factor can be computed as the phase difference between the reference conventional spin echo and the reference spectral spin echo in the Fourier transform domain. The phase correction factor can then be used to phase correct the even-numbered echoes in the acquired data, as indicated at step 114. For example, the phase correction factor can be used to remove the quadratic phase modulation in the even-numbered echoes, restoring a conventional echo shape and making the echoes readily usable for spatial encoding.

Image reconstruction then proceeds, as indicated at step 116. For example, image reconstruction can proceed via a simple Fast Fourier Transform along corresponding points from each echo in the echo train. When reference data are acquired, the reference data can be included in the data from which images are reconstructed. For example, although the reference echoes are acquired without TRASE modulation, the first echo (or the second echo after correction) can be used as the center of the TRASE k-space dataset. Therefore, in addition to being used for phase corrections, these echoes can be included as part of the data from which images are reconstructed.

For two-dimensional imaging applications, data are acquired in step 108 by sampling k-space with a set of echo trains that make use of RF phase gradients in four different directions. For example, and as illustrated in FIGS. 2A-2D, phase gradients can be established along the positive and negative x-direction ($RF_{+x}$, $RF_{-x}$) and along the positive and negative y-direction ($RF_{+y}$, $RF_{-y}$). In this example, the TRASE coil produces an RF transmit field with a variation of the RF phase along one of these spatial directions. This phase variation may be, for example, a linear variation. In general, any two different spatial phase gradients can be used for TRASE encoding; however, if they are not both linear, the resolution would become spatially-varying and generalized image reconstruction would likely be needed. In FIGS. 2A-2D, the target field-of-view spans the approximately linear region of the curves.

For TRASE, each refocusing pulse reflects the k-space trajectory through the k-space origin defined by the presently applied RF phase gradient. As the phase gradient is changed between pulses, the trajectory moves to different k-space points, until the entire desired k-space grid has been acquired.

Different echo trains can be sampled using different sequences of these four RF phase gradients when forming the echoes in the echo train. Preferably, a phase alternation scheme is also implemented to separate the conventional and spectral spin echo coherence pathways to mitigate artifacts caused by mixture of the two coherence pathways. An example set of such sequences is illustrated in Table 1.

TABLE 1

Example set of echo trains used to sample an 8 × 8 2D k-space matrix

| Echo Train Number | RF Excitation | Echo Number | | | | | | | |
|---|---|---|---|---|---|---|---|---|---|
| | | 1 | 2 | 3 | 4 | 5 | 6 | 7 | 8 |
| 1 | +X | +X | −Y | +Y | −Y | +Y | −Y | +Y | −Y |
| 2 | +X | +X | −Y | +Y | −Y | +Y | −Y | +Y | −X |
| 3 | +X | +X | −Y | +Y | −Y | +Y | −Y | +X | −X |
| 4 | +X | +X | −Y | +Y | −Y | +Y | −X | +X | −X |
| 5 | +X | +X | −Y | +Y | −Y | +X | −X | +X | −X |
| 6 | +X | +X | −X | +X | −X | +X | −X | +X | −X |
| 7 | +X | +X | −X | +X | −X | +X | −X | +X | −X |
| 8 | +X | +Y | −X | +X | −X | +X | −X | +X | −X |

For illustrative purposes, in this example eight echo trains, each containing eight echoes, are utilized. In practice, more or less echo trains may be generated, and each echo train may include more or less than eight echoes.

Figure 3:
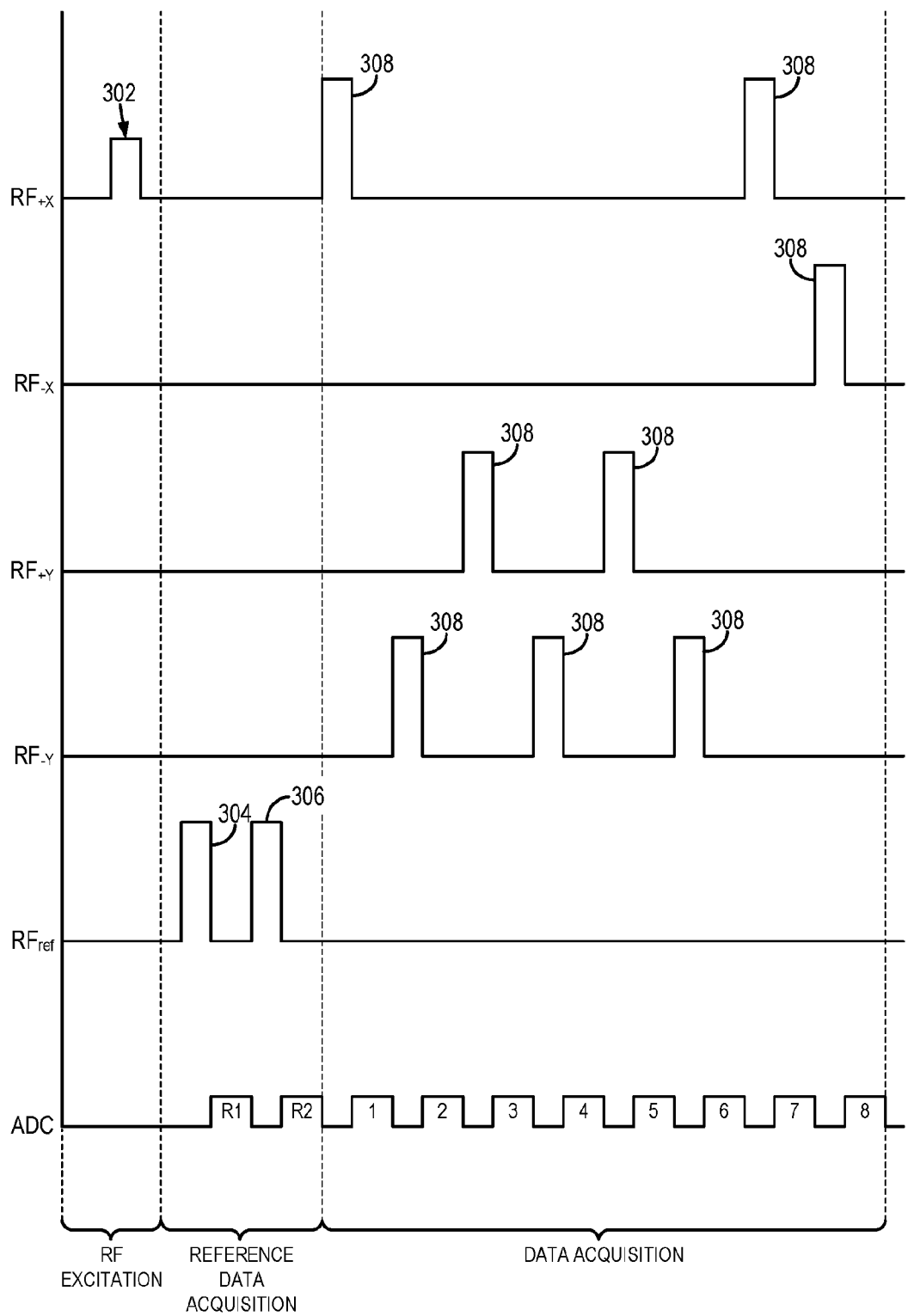
FIG. 3 is a pulse sequence diagram of an example pulse sequence that can be implemented to acquired k-space data in which swept RF refocusing pulses applied with RF phase gradients provide spatial encoding of magnetic resonance signals.

An example of a pulse sequence diagram for a pulse sequence that implements the echo train number 3 from Table 1 is illustrated in FIG. 3. In this example pulse sequence, reference data are also acquired; however, as mentioned above, in some embodiments the reference data do not need to be acquired. The pulse sequence shown in FIG. 3 includes a swept RF excitation pulse 302 that is applied with a phase gradient along the positive x-direction (e.g., the phase gradient shown in FIG. 2A).

Following excitation, an echo train is formed by applying a sequence of swept RF refocusing pulses. The echo train includes two reference echoes that are formed in response to swept RF refocusing pulses 304 and 306, respectively. The swept RF refocusing pulses 304 and 306 can be applied without an RF phase gradient, or can be applied in one of the phase states X+, X−, Y+, or Y−.

The remainder of the echo train includes echoes that are formed in response to swept RF refocusing pulses 308 that are applied with different RF spatial phase gradients (e.g., according to the example echo train sequencing shown in Table 1), thereby causing the data to traverse k-space in the desired pattern.

The methods described above with respect to a TRASE spatial encoding technique can be used in other spatial encoding techniques. For example, the same spin echo train sequence, in which a broadband (e.g., swept) RF refocusing pulse and a phase correction method are used to create spin echo trains in an inhomogeneous $B_0$ field, can also be used for Bloch-Siegert shift spatial encoding. In such an implementation, the swept RF refocusing pulses would be played on a uniform RF transmit coil, and off-resonant pulses would be played on a transmit coil with a $B_{1+}$ amplitude ramp to create a spatially-varying phase shift for spatial encoding. In this case, $B_{1+}$ amplitude gradients are used for spatial encoding instead of $B_{1+}$ phase gradients.

As another example, the swept RF refocusing trains can also be used with conventional spatial encoding using switched $B_0$ gradient fields. In these implementations, the $B_0$ gradients could be used for either frequency encoding (i.e., readout gradients) or phase encoding.

Figure 4:
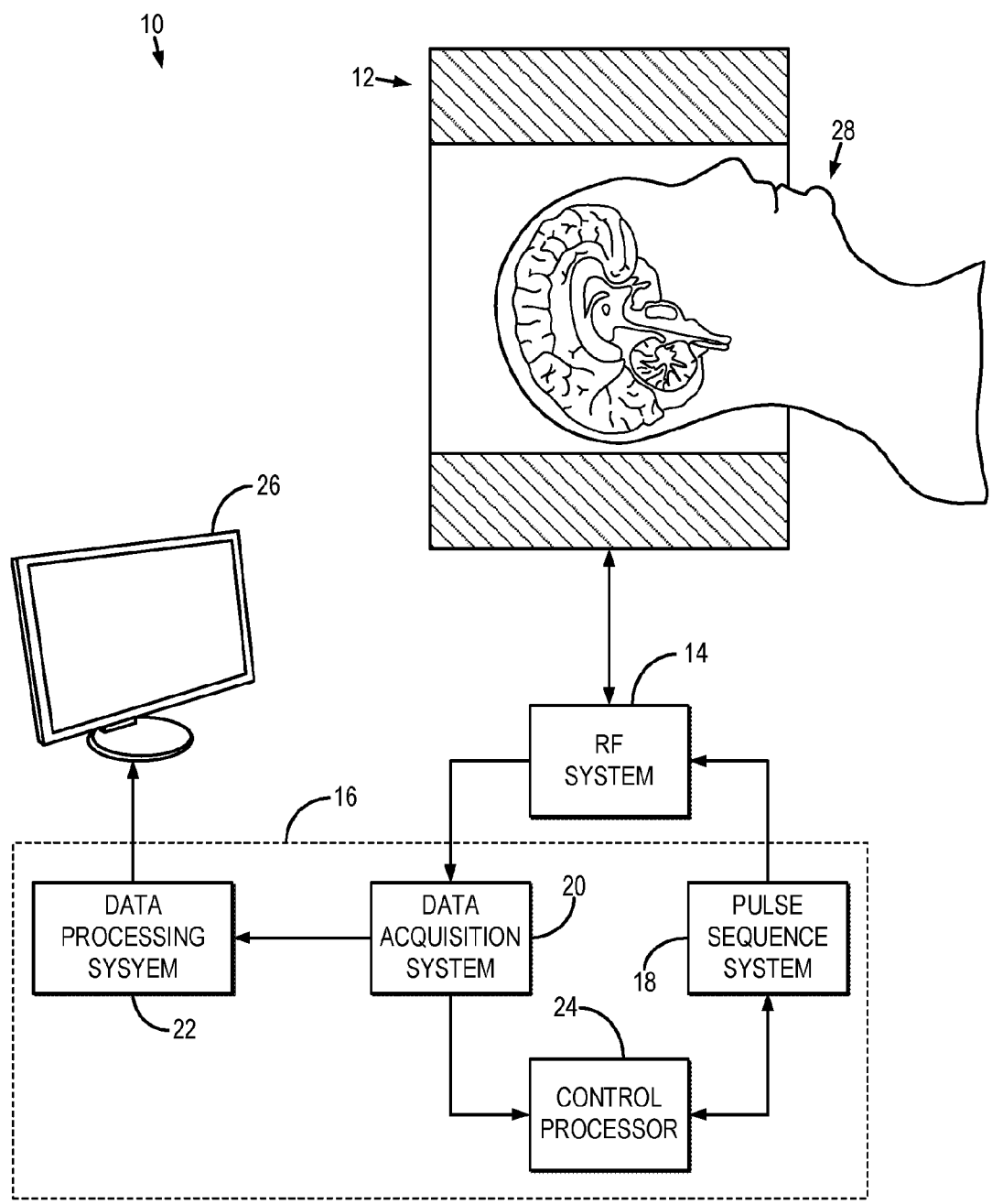
FIG. 4 is a block diagram of an example portable magnetic resonance imaging ("MRI") system that can implement the methods described herein.

FIG. 4 shows an example of a portable MRI system 10 that can implement the methods described here generally includes a magnet assembly 12, a radio frequency ("RF") system 14, and a controller 16. The magnet assembly 12 can include electromagnets or a permanent magnets to generate a polarizing $B_0$ magnetic field. For example, a light-weight superconducting magnet may be used. Because the homogeneity requirement of the magnetic field can be relaxed using the swept RF TRASE imaging techniques described here, the weight of such a superconducting magnet is significantly reduced compared to those superconducting magnets used in conventional clinical MRI systems.

The controller 16 may include, for example, a pulse sequence system 18, a data acquisition system 20, a data processing system 22, and a control processor 24. The portable MRI system 10 may also include a display 26 for viewing images of the subject 28 obtained with the portable MRI system 10 and for providing a user interface between the operator and the controller 16. The portable MRI system 10 does not require magnetic gradient coils or high-power gradient amplifiers. Thus, the RF system 14 and controller 16 may be constructed of small signal electronics and a small RF power amplifier for increased portability of the portable MRI system 10.

The RF system 14 can receive instruction from the pulse sequence system 18 to perform a pulse sequence, such as those described above, that implements the swept RF TRASE imaging techniques described above. The RF system 14 can also switch the phase of the TRASE coil spatial phase gradient to traverse k-space using RF encoding. In one embodiment, the sign of this spatial phase gradient is switched by applying a 180 degree phase shift to RF pulses sent to one channel of a two-channel TRASE coil array. The data processing system 22 may perform phase correction and image reconstruction of the acquired data. In general, the controller 16 can be implemented using one or more computer processors.

The present disclosure has described one or more preferred embodiments, and it should be appreciated that many equivalents, alternatives, variations, and modifications, aside from those expressly stated, are possible and within the scope of the invention.

The invention claimed is:

1. A method for spatially encoding magnetic resonance signals in inhomogeneous magnetic fields without the use of magnetic field gradients, the steps of the method comprising:
   (a) applying a swept radio frequency (RF) excitation pulse with a magnetic resonance imaging (MRI) system to a field-of-view to excite spins therein and without the use of magnetic field gradients to spatially encode the spins;
   (b) applying a series of swept RF refocusing pulses with the MRI system to the field-of-view to refocus spins therein to form an echo train in which odd-numbered echoes in the echo train are conventional spin echoes and even-numbered echoes in the echo train are spectral spin echoes, and in which each of the swept RF refocusing pulses is applied with an RF phase gradient along a spatial direction; and
   (c) acquiring data by sampling echoes in the echo train using the MRI system.

2. The method as recited in claim 1, wherein the swept RF excitation pulse and the swept RF refocusing pulses are wideband, uniform rate, smooth truncation (WURST) RF pulses.

3. The method as recited in claim 1, wherein sequential ones of the swept RF refocusing pulses in the series of swept RF refocusing pulses are applied with an RF phase gradient along different spatial directions.

4. The method as recited in claim 1, wherein the swept RF refocusing pulses are applied with an RF phase gradient along one of a positive first direction, a negative first direction, a positive second direction, or a negative second direction, and wherein the first direction is orthogonal to the second direction.

5. The method as recited in claim 4, wherein the first direction is an x-direction, the second direction is a y-direction, and wherein the x-direction and the y-direction are mutually orthogonal to a z-direction along which a magnetic field of the MIl system is oriented.

6. The method as recited in claim 1, further comprising reconstructing an image from the acquired data using one of a Fourier transform or a generalized image reconstruction.

7. The method as recited in claim 6, wherein data acquired by sampling the spectral spin echoes are phase-corrected before reconstructing the image.

8. A method for spatially encoding magnetic resonance signals in inhomogeneous magnetic fields without the use of magnetic field gradients, the steps of the method comprising:
   (a) applying a swept radio frequency (RF) excitation pulse with a magnetic resonance imaging (MRI) system to a field-of-view to excite spins therein;
   (b) applying a series of swept RF refocusing pulses with the MRI system to the field-of-view to refocus spins therein to form an echo train in which odd-numbered echoes in the echo train are conventional s in echoes and even-numberedechoes in the echo train are spectral spin echoes, and in which each of the swept RF refocusing pulses is applied with an RF phase gradient along a spatial direction;
   (c) acquiring data by sampling echoes in the echo brain using the MRI system;

further comprising reconstructing an image from the acquired data using one of a Fourier transform or a generalized image reconstruction;
wherein data acquired by sampling the spectral spin echoes are phase-corrected before reconstructing the image; and
further comprising acquiring reference data from the excited spins and phase correcting the spectral spin echoes using the reference data, wherein the reference data are acquired by applying at least two swept RF refocusing pulses to the field-of-view to generate a reference conventional spin echo and a reference spectral spin echo, and in which the at least two swept RF refocusing pulses are applied with a same RF phase gradient.

9. The method as recited in claim 8, wherein the same RF phase gradient is a zero RF phase gradient.

10. The method as recited in claim 8, wherein phase correcting the spectral spin echoes in the acquired data includes computing a phase difference between the reference conventional spin echo and the reference spectral spin echo in a Fourier transform domain and removing a quadratic phase modulation from the spectral spin echoes in the acquired data using the computed phase difference.

11. The method as recited in claim 1, wherein steps (a)-(c) are repeated to acquire data from multiple different echo trains such that k-space is sampled along interleaved trajectories.

12. A method for spatially encoding magnetic resonance signals in inhomogeneous magnetic fields without the use of magnetic field gradients, the steps of the method comprising;
(a) applying a swept radio frequency (RF) excitation pulse with a magnetic resonance imaging (MRI) system to a field-of-view to excite spins therein;
applying a series of swept RF refocusing pulses with the MRI system to the field-of-view to refocus spins therein to form an echo train in which odd-numbered echoes in the echo train are conventional spin echoes and even-numbered echoes in the echo train are spectral spin echoes, and in which each of the swept RF refocusing pulses is applied with an RF phase gradient along a spatial direction;
(c) acquiring data by sampling echoes in the echo train using the MRI system;
wherein steps (a)-(c) are repeated to acquire data from multiple different echo trains such that k-space is sampled along interleaved trajectories; and
further comprising combining data from interleaved k-space trajectories and reconstructing an image from the combined data.

13. The method as recited in claim 11, further comprising combining data from at least two of the multiple different echo trains and reconstructing an image from the combined data.

14. The method as recited in claim 1, wherein steps (a)-(c) are repeated to acquire data from multiple different echo trains such that k-space is sampled along segmented trajectories.

15. The method as recited in claim 1, wherein the MRI system is a portable MRI system.

16. The method as recited in claim 1, further comprising applying magnetic field gradients to spatially encode the odd-numbered echoes and the even-numbered echoes in the echo train.

17. The method as recited in claim 1, further comprising applying off-resonant RF pulses between successive ones of the series of swept RF refocusing pulses using RF coils having B1+ amplitude gradients to spatially encode the odd-numbered echoes and the even-numbered echoes in the echo train.

* * * * *

UNITED STATES PATENT AND TRADEMARK OFFICE
CERTIFICATE OF CORRECTION

| | | |
|---|---|---|
| PATENT NO. | : 10,830,851 B2 | Page 1 of 1 |
| APPLICATION NO. | : 16/092686 | |
| DATED | : November 10, 2020 | |
| INVENTOR(S) | : Lawrence L. Wald et al. | |

It is certified that error appears in the above-identified patent and that said Letters Patent is hereby corrected as shown below:

In the Claims

Column 8, Claim 5, Line 44, "Mill" should be --MRI--.

Column 8, Claim 8, Line 61, "conventional s in" should be --conventional spin--.

Column 9, Claim 12, Line 36, "applying" should be --(b) applying--.

Column 10, Claim 12, Line 4, "RE" should be --RF--.

Signed and Sealed this
Twelfth Day of January, 2021

Andrei Iancu
*Director of the United States Patent and Trademark Office*